(12) United States Patent
Hsiao et al.

(10) Patent No.: US 6,582,988 B1
(45) Date of Patent: Jun. 24, 2003

(54) METHOD FOR FORMING MICRO LENS STRUCTURES

(75) Inventors: Yu-Kung Hsiao, Tao-Yuan (TW); Sheng-Liang Pan, Hsin Chu (TW); Bii Junq Chang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/902,894

(22) Filed: Jul. 12, 2001

Related U.S. Application Data

(63) Continuation-in-part of application No. 09/408,701, filed on Sep. 30, 1999, now abandoned.

(51) Int. Cl.⁷ .................... H01L 21/00; H01L 21/339
(52) U.S. Cl. ................................. 438/70; 438/72
(58) Field of Search .................. 438/70, 72, 60, 438/69, 71, 75, 149, 65, 59, 706, 710, 712, 713

(56) References Cited

U.S. PATENT DOCUMENTS

| | | | |
|---|---|---|---|
| 5,321,297 A | 6/1994 | Enomoto | 257/432 |
| 5,364,498 A | 11/1994 | Chen | 156/650 |
| 5,514,888 A | 5/1996 | Sano et al. | 257/232 |
| 5,739,548 A | 4/1998 | Shigeta et al. | 257/59 |
| 5,976,907 A * | 11/1999 | Shigeta et al. | 438/65 |
| 6,171,885 B1 * | 1/2001 | Fan et al. | 438/70 |

* cited by examiner

*Primary Examiner*—Savitri Mulpuri
(74) *Attorney, Agent, or Firm*—George O. Saile; Stephen B. Ackerman

(57) ABSTRACT

The present invention features a method for forming micro lens arrays on light-sensitive or light-emitting semiconductor structures. A unique oxygen plasma etch "descum" step is performed prior to the lens reflow hardbake. In addition, a photo-sensitive planarization layer place immediately atop a color filter layer results in fewer process steps. The micro lens array thus formed has a minimal number of merged or collapsed lenses and residue on bond pad areas is significantly reduced.

15 Claims, 9 Drawing Sheets

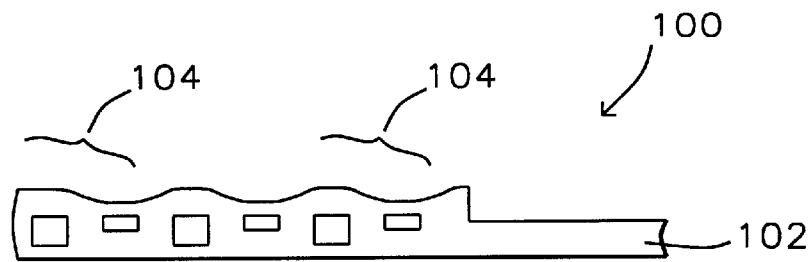
*FIG. 1a - Prior Art*
*FIG. 1b - Prior Art*
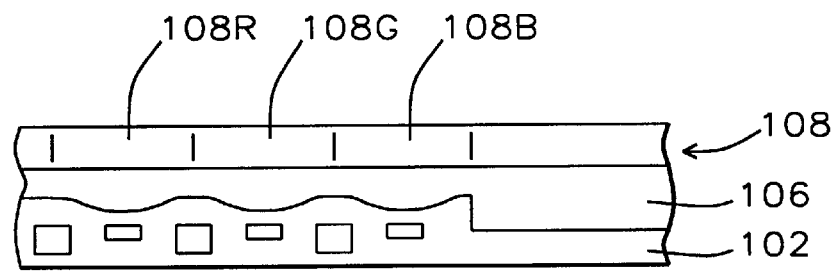
*FIG. 1c - Prior Art*

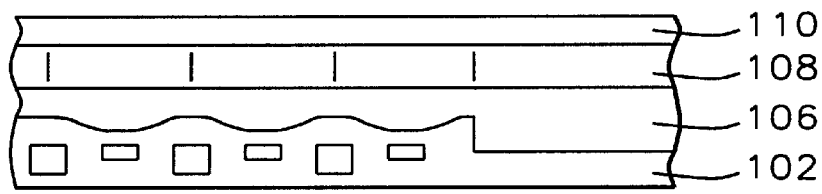
*FIG. 1d - Prior Art*
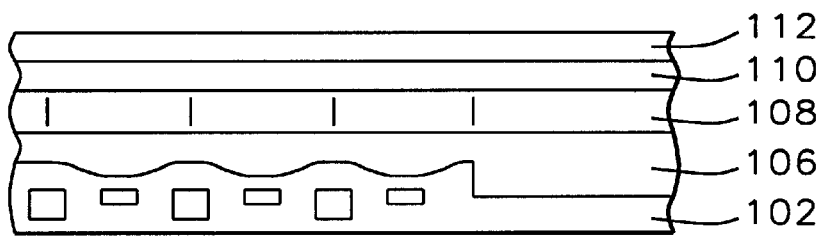
*FIG. 1e - Prior Art*
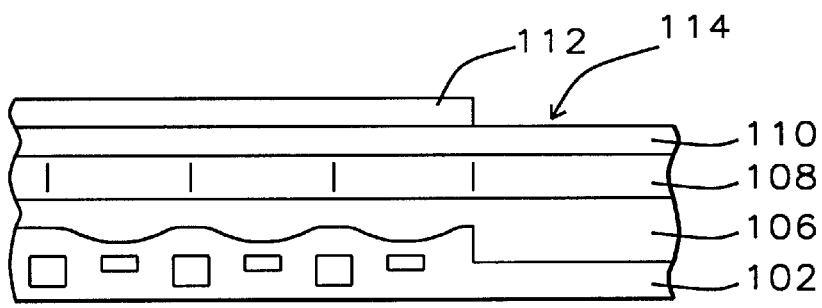
*FIG. 1f - Prior Art*

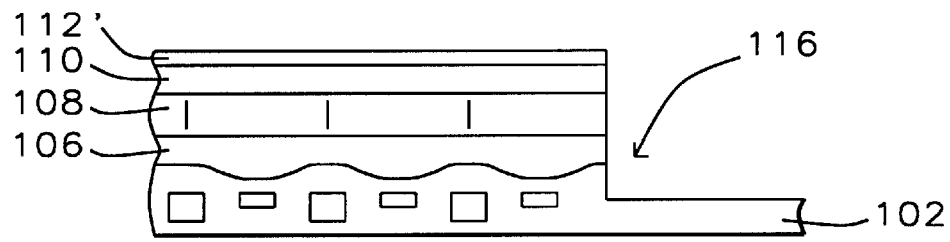
*FIG. 1g – Prior Art*
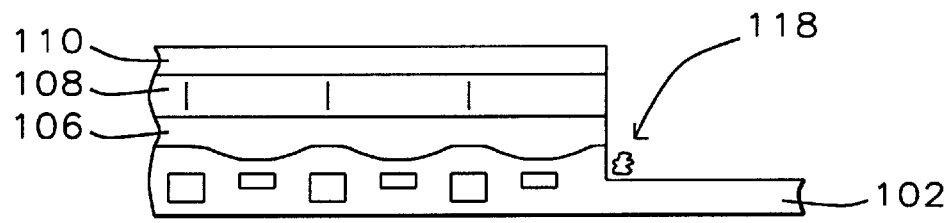
*FIG. 1h – Prior Art*
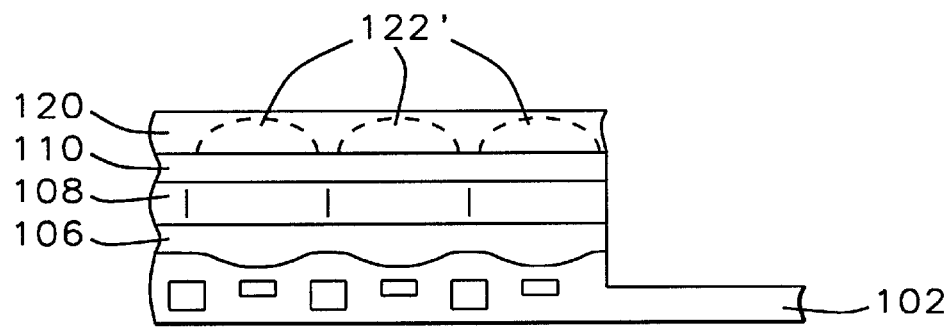
*FIG. 1i – Prior Art*

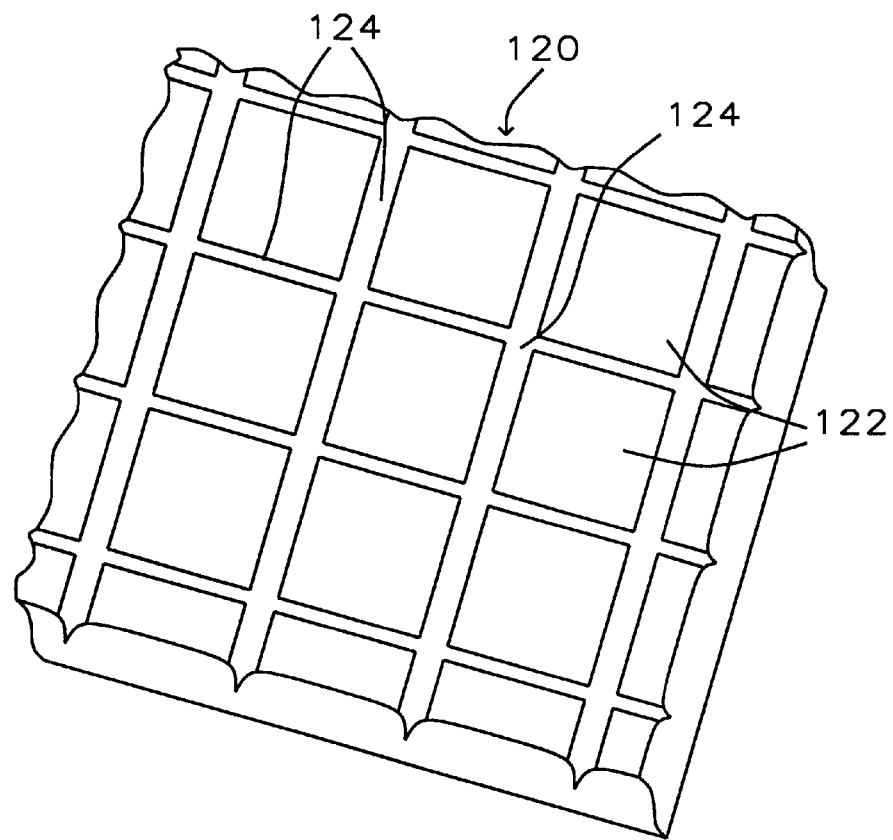
*FIG. 2a - Prior Art*
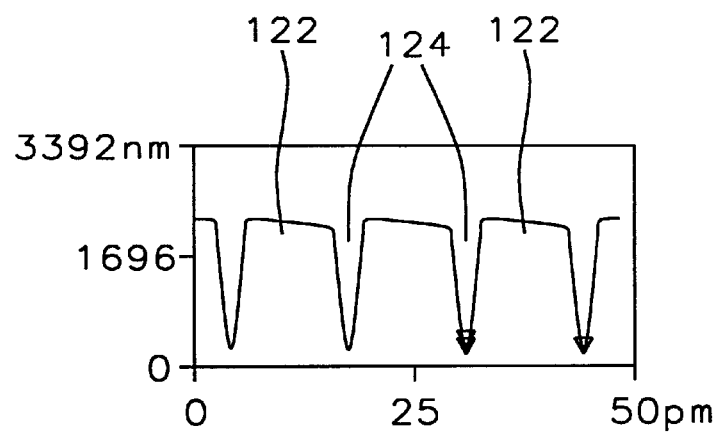
*FIG. 2b - Prior Art*

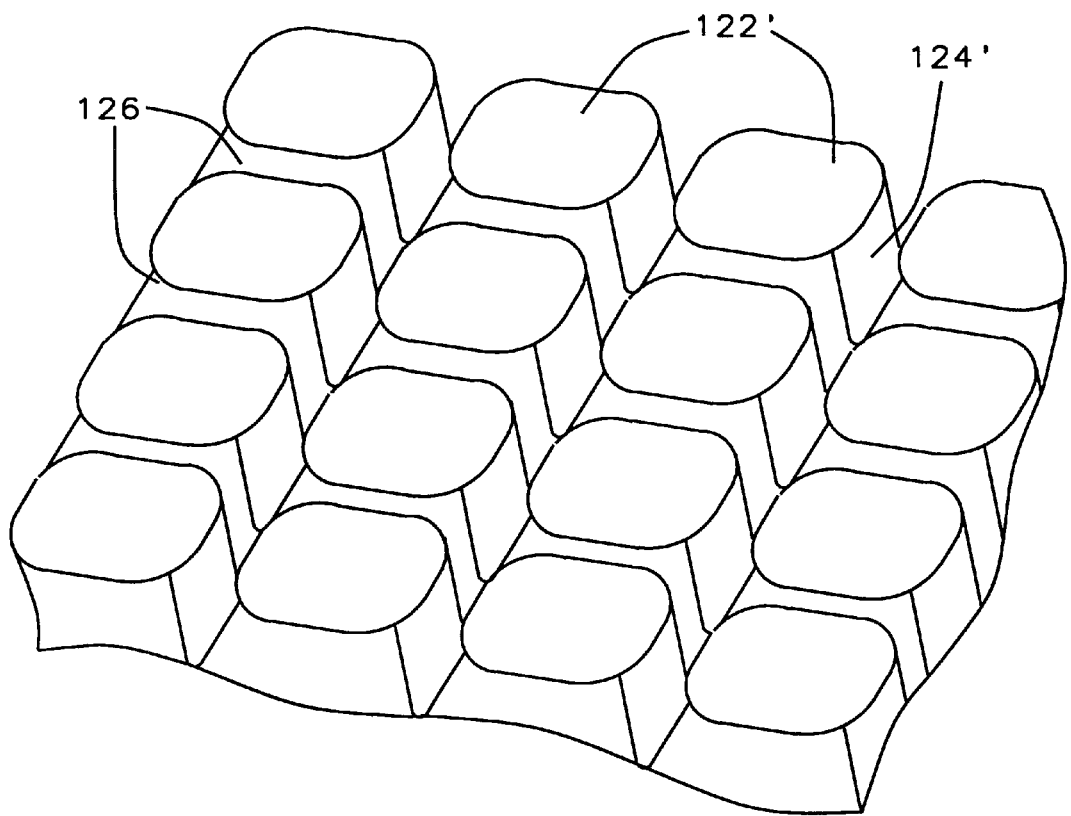
FIG. 3a - Prior Art
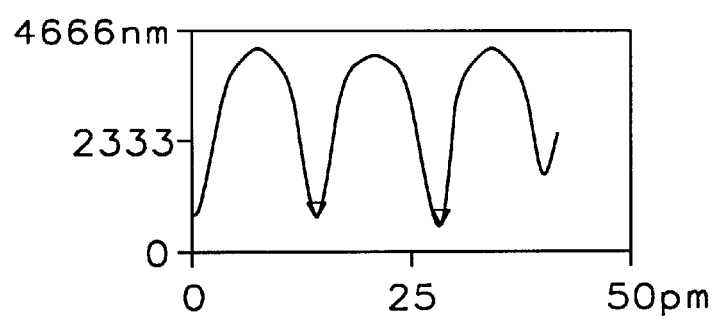
FIG. 3b - Prior Art

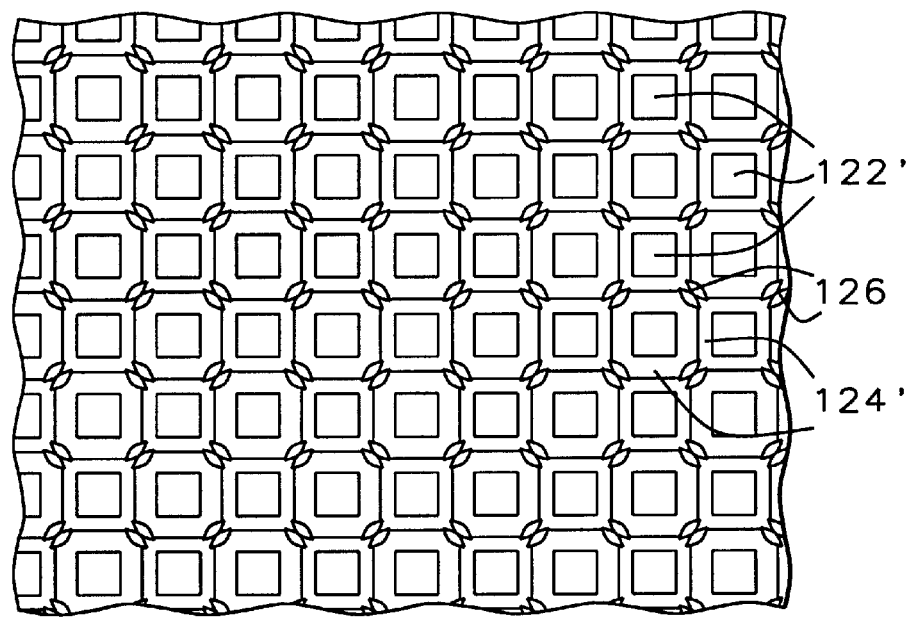
*FIG. 4 - Prior Art*
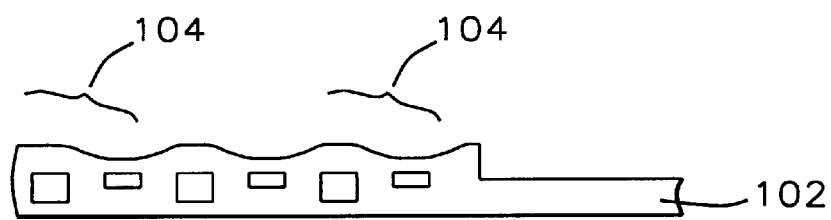
*FIG. 5a*
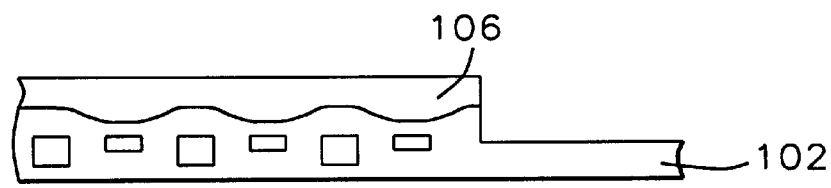
*FIG. 5b*

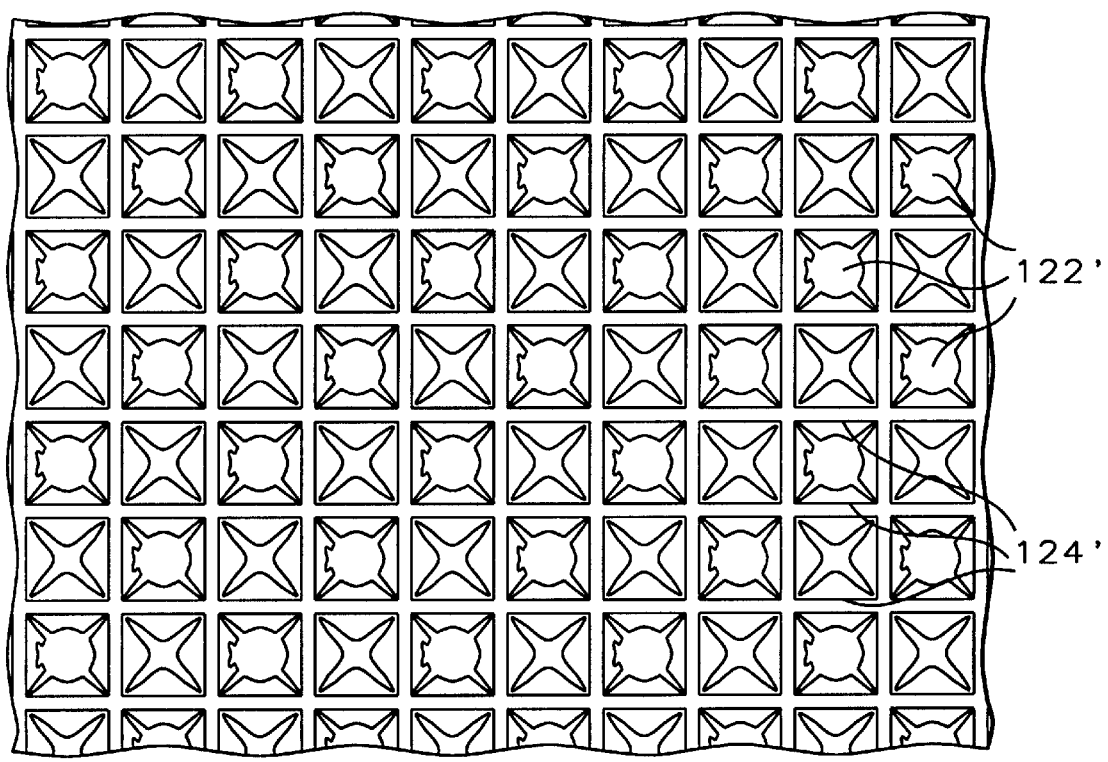
FIG. 6 – Prior Art

METHOD FOR FORMING MICRO LENS STRUCTURES

This application is a continuation in part of U.S. Pat. application Ser. No. 09/408,701 filed on Sep. 30, 1999, now abandoned.

FIELD OF THE INVENTION

The present invention relates to the manufacture of semiconductor devices incorporating micro lens structures and, more particularly to the manufacture of micro lens structures where micro lens merger and collapse phenomena are minimized.

BACKGROUND OF THE INVENTION

Micro lenses are optical components on semiconductors utilized as solid state imaging and/or microdisplay devices. Generally deployed in arrays, each micro lens acts as a light-gathering or light-dispersing element associated with a single-pixel or sub-pixel element in the solid-state device. One of the most important considerations in designing and manufacturing micro lenses is photosensitivity (i.e., the ability of the lens to gather or disperse light). One reason micro lens photosensitivity may be reduced is that the area of each micro lens has been reduced below an optimum value. This reduction has been necessitated by the manufacturing techniques of the prior art that cause individual lens areas to flow into one another (lens merger) or lens collapse during a hardbake reflow operation, thereby necessitating wide inter-lens bands.

Another common problem in the manufacture of semiconductor devices with micro lenses is residue left on bond pad areas (e.g., the areas between or adjacent individual micro lenses) where electrical interconnections must be made. Bond bad residue has traditionally been treated by increasing exposure energy levels or prolonging developing time during the processing of the wafers. These solutions, however, both result in decreased surface areas of the pre-hardbake micro lens regions and, consequently, in smaller finished micro lens structures having reduced optical performance.

It is possible to reduce the problem of inter-lens/bond pad residue by adding additional process steps (e.g., an additional lithographic step). However, these steps add processing cost and introduce the possibility of lower wafer yields.

DESCRIPTION OF THE RELATED ART

U.S. Pat. No. 5,321,297 for SOLID STATE IMAGE PICKUP DEVICE HAVING LIGHT CONVERSION LENS FORMED ON A STRIP AREA; issued Jun. 14, 1994 to Tadashi Enomoto, teaches a method wherein individual micro lens structures may be individually adjusted. Variation in x-axis vs; y-axis sensitivity due to spherical aberration and other phenomena may thereby be controlled. Specifically, a strip layer is formed above a plurality of photosensitive sections, disposed in a row direction. Light-converging lenses are formed on each strip layer to obtain a desired curvature or thickness. In contradistinction, the method of the instant invention provides no individual control of the optical characteristics of the micro lenses but rather the unique descum process step allows for much tighter control of the optical parameters of all the micro lenses in the array so that both the optical characteristics and the process yield are enhanced.

U.S. Pat. No. 5,364,498 for ETCH METHOD FOR MANUFACTURING A COLOR FILTER; issued Nov. 15, 1994 to Kun-Ti Chen teaches forming a color filter layer by the deposition of a plurality of interference films on a substrate of black matrix material. CHEN does not teach the formation of micro lens structures. The method of the present invention, however, teaches an improved process for the formation of micro lens structures over a suitable color filter.

U.S. Pat. No. 5,514,888 for ON-CHIP SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and reflow techniques. The inventive method, on the other hand, utilizes a unique descum step which, in combination with other process steps, minimizes the formation of faulty lens structures either because of lens merger or lens collapse. Bond pad areas are also kept substantially residue free in the inventive method.

U.S. Pat. No. 5,739,548 for SOLID STATE IMAGING DEVICE HAVING A FLATTENING LAYER AND OPTICAL LENSES; issued Apr. 14, 1998 to Yoko Shigeta, et al. teaches a resin lens structure on a solid state imaging device. A remelt step at a temperature lower than the resin melting point keeps the lens structures from flowing out (i.e., merging). No descum step is taught and, consequently, the lenses formed according to these teachings sufferer from the same failure mechanisms as with other prior art methods.

Nothing in the above-described or any other known references, taken individually or in any combination, teaches or suggests the unique descum step of the present invention.

SUMMARY OF THE INVENTION

It is the object of the present invention to provide a method for forming micro lens arrays on light-sensitive or light-emitting semiconductor structures which minimizes lens merger or lens collapse during the reflow operation. A unique descum step is performed prior to a lens reflow step resulting in a low incidence of lens merger or lens collapse. A second objective of the present invention is to provide a method in which the bond pad areas are kept free of residue which results in improved reliability of the electrical interconnections.

BRIEF DESCRIPTION OF THE DRAWINGS

A complete understanding of the present invention may be obtained by reference to the accompanying drawings, when taken in conjunction with the detail description thereof and in which:

FIGS. 1a–1i are schematic, sectional views showing the successive stages in a conventional process for forming micro lens structures;

FIG. 2a is a perspective view of a portion of a micro lens region prior to a hardbake operation in a conventional process;

FIG. 2b is a cross-sectional view of the portion of the micro lens region of FIG. 2a;

FIG. 3a is a perspective view of a portion of a micro lens region after a hardbake operation in a conventional process;

FIG. 3b is a cross-sectional view of the portion of the micro lens region after a hardbake operation of FIG. 3a;

FIG. 4 is a top, plan view of a portion of a micro lens array of the prior art showing inter-lens defects;

FIGS. 5a–5h are schematic, sectional views showing the successive stages for forming micro lens structures in accordance with the present invention; and FIG. 6 is a top, plan view of a portion of a defect-free micro lens array made in accordance with the present invention.

DESCRIPTION OF THE CONVENTIONAL PROCESS

Figure 5C:
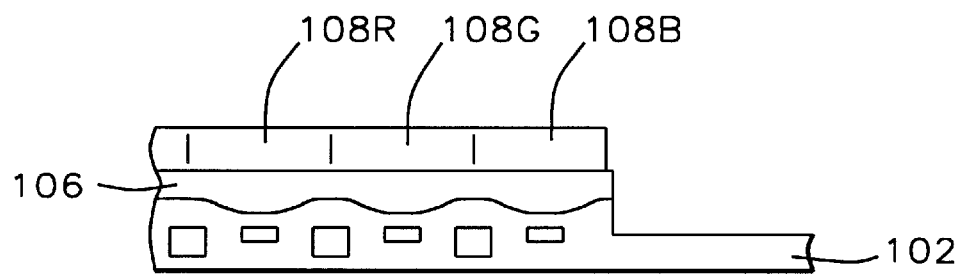

Micro lens arrays are generally formed on the top surfaces of silicon chips, either light-sensitive (e.g., CCDs) or light-emitting (e.g., microdisplay devices). A planarization layer is first formed over the silicon substrate. A color filter layer is next formed over the planarization layer with sub-pixel areas properly aligned with active devices in the silicon substrate. Another planarization layer is generally formed over the color filter layer and, finally a photo resist (PR) material is deposited over the second planarization layer. Conventional lithographic techniques are then utilized to form rectangular patterns in the PR. After exposure, a development step removes the PR in the exposed areas leaving the central island regions over the pixel-active areas transparent. Development and sometimes etching, removes the PR material between these central regions and forms trenches in the PR area separating the islands of PR now defining the individual micro lens sites. A deep plasma etch into the silicon substrate next removes all layers above the substrate. PR is then stripped. and the devices are hardbaked to reflow the micro lenses into the proper optical form by controlling time and temperature.

Referring first to FIGS. 1a–1i, there are shown the processing steps used to create a micro lens array of the prior art. A silicon substrate 102 bearing a plurality of CMOS devices 104 is the starting point for a typical micro lens process. A non-photo sensitive planarization layer 106 is first deposited over substrate 102 (FIG. 1b).

Next, a color filter layer 108 is placed over the top of planarization layer 106. Individual Red/Green/Blue (RGB) sub-pixel areas 108R, 108G, 108B, respectively, are shown aligned over corresponding CMOS devices 104 in substrate 102 FIG. 1c).

A planarizaton layer 110 is next formed over color filter 108 (FIG. 1d).

The processing steps described heretofore (FIGS. 1a–1d) are considered universal in the production of micro lens-equipped semiconductor devices. From this stage, however, there are several ways well known to those skilled in the art to proceed with the formation of a micro lens array. A typical process consists of next depositing a layer of a positive photo resist (POSI) layer 112 over planarization layer 110 (FIG. 1e). Conventional optical lithographic techniques are used to expose POSI layer 112 which is then developed using conventional processing techniques well know to those skilled in the art. Resist-free regions 114 expose portions of planarization layer 110 (FIG. 1f)

A plasma etch step, generally using O2 plasma, etches through exposed regions 114 of planarization layer 110, color filter 108, planarization layer 106 and into silicon substrate 102, shown as region 116 (FIG. 1g). A thinned portion 112' of POSI layer 112 remains which must next be stripped using conventional PR stripping techniques well known to those skilled in the art. Conventional stripping techniques, however, tend to leave residue 118, especially when step region 116 is relatively high (FIG. 1h).

Finally, a layer of thermally-flowable resin 120, typically display material manufactured by JSR Corporation and supplied as catalog number MFR-344H is deposited over planarization layer 110 and the exposed regions of substrate 102. The shapes of the actual micro lenses 122' to be formed are also shown.

The detailed steps for forming a micro lens array in resin layer 120 are now described. Referring now to FIG. 2a, there is shown a schematic, perspective view of a portion of resin layer 120 formed over planarization layer 110 and etched regions 116 (FIG. 1g). Raised areas 122 and trench areas 124 correspond to non-etched regions and etched regions 116, respectively. Each raised area 122 corresponds to a single sub-pixel region associated with a single CCD 104 (FIG. 1a). Referring now also to FIG. 2b, there is shown a cross-sectional view of the region shown in FIG. 2a. Trench regions 124 and raised regions 122 are clearly defined.

The next step in the formation of the micro lens array is a hardbake operation where the resin layer 120 is heated to a temperature at which the material flows. The geometry defined in previous process steps as well as the chosen time and temperature for the hardbake operation determine the final shape of the individual lens regions 122' (FIG. 3a) to be formed by reflow of resin in raised regions 120 during the hardbake. Referring next to FIG. 3, there is shown the a perspective view of the region shown in FIG. 2a after the hardbake operation. Lens regions 122' have now been formed at the raised regions. FIG. 3b is a cross-sectional view clearly showing the profile of the micro lenses 122'. Trenches 124' still exist.

Referring now to FIG. 4, there is shown a macro photograph of a portion of a micro lens display formed in accordance with the prior art steps described hereinabove. The both the centers of the micro lens structure 122' and trenches 124' may be seen. Also clearly visible are darkened regions 126 at intersections of trenches 124'. Regions 126 represent defects in the micro lens array, namely lens merger that is, regions where resin from individual regions 120 has flowed together with resin material forming an adjacent region 120. When either lens merger or lens collapse occurs, the overall performance of the affected micro lenses is degraded. Prior to the instant invention, the only practical way to prevent lens merger and/or lens collapse was to reduce the center-to-center distances of the micro lenses 124'. This resulted in smaller finished lens regions 124' having less than optimum optical performance. This also necessitated a lower pixel density on the devices. If high pixel densities were required, the thickness and other physical characteristics of resin layer 120 had to be carefully controlled with the resulting micro lenses 124' having a defined profile that was far from optimum from an optical performance perspective.

DESCRIPTION OF THE PREFERRED EMBODIMENT

Referring now to FIGS. 5a–5h, there are shown the modified processing steps of the instant invention whereby lens merger and other hardbake-related lens defects are minimized and both superior optical performance of the micro lens array and high pixel densities may be obtained.

A silicon substrate 102 bearing a plurality of CMOS devices 104 is the same starting point as in the processes of the prior art (FIG. 5a). As in the prior art, a non-photo sensitive planarization layer 106 is deposited over substrate 102 (FIG. 5b).

Next, a color filter layer 108 is placed over the top of planarization layer 106. Individual Red/Green/Blue (RGB) sub-pixel areas 108R, 108G, 108B, respectively, are shown aligned over corresponding CMOS devices 104 in substrate 102 FIG. 5c).

Figure 5D:
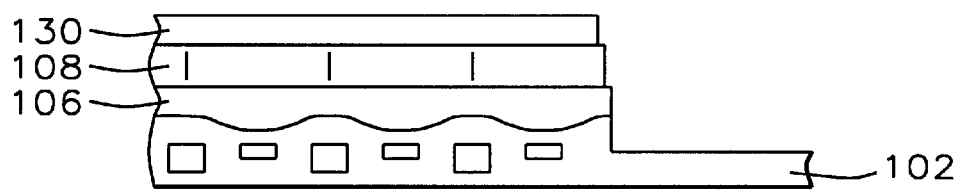

The instant invention utilizes a negative type photo-sensitive material for the planarization/passivation layer 130 formed directly over color filter layer 108 (FIG. 5d). One material found suitable for this application is a novolac/acylic mixture supplied as CT-3050L by Fuji-Olin Corporation. This material has been shown to provide a high level of transmittance in the finished micro lens structures. The photo-sensitive planarization layer 130 is then exposed, developed and hardbaked as shown in FIG. 5d.

Figure 5E:
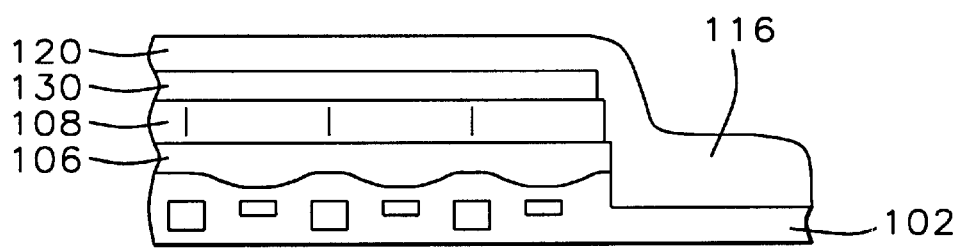
Figure 5F:
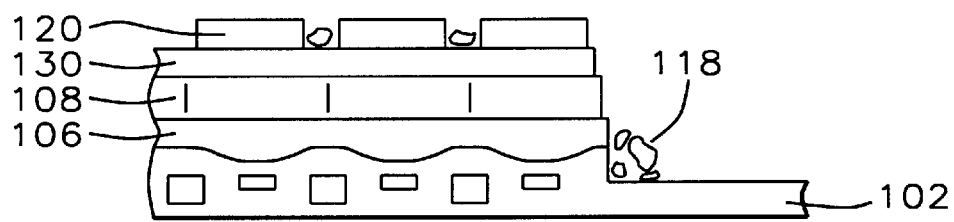
Figure 5G:
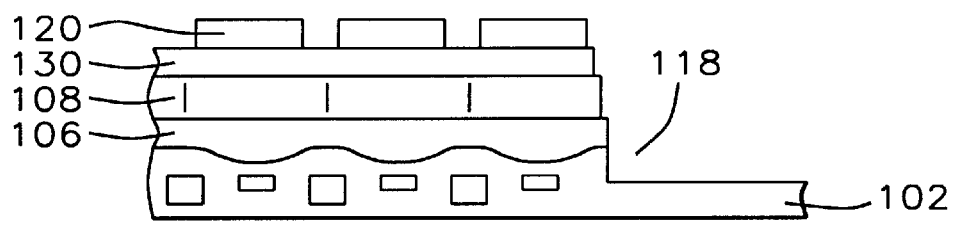

Next, utilizing a positive type photo-sensitive material, a layer of lens forming material 120 is applied to the substrate, covering the planarization layer 130 and the bond pad area 116 as shown in FIG. 5e. One material found suitable for this application is a mixture of melamine resin and generic novolac base resin. Individual lens areas 122' are formed in the lens material layer 120 by masked exposure and developing.

Next, a plasma etch step, generally using O2 plasma, etches through the exposed regions 114 of planarization layer 130 to define the micro lens array.

Figure 5H:
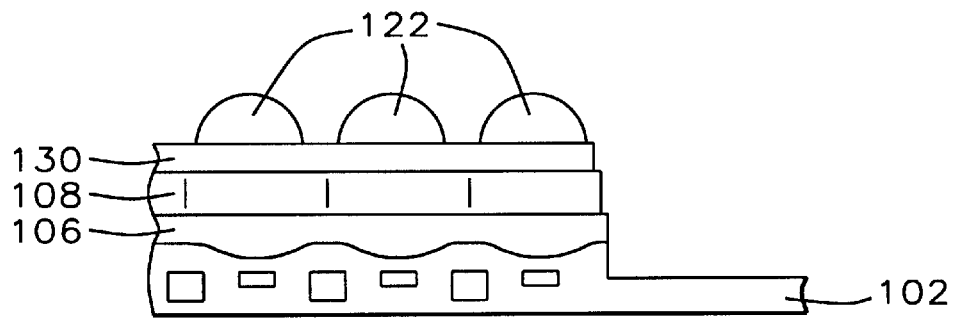

Conventional stripping techniques, however, tend to leave residue 118, which can accumulate from all previous process steps especially when step region 116 is relatively high (FIG. 5h). The advantage of the inventive method is that the plasma etch step effectively eliminates any residual scum 118, which has been found to be the primary mechanism for micro lens reflow or collapse in devices manufactured in accordance with the prior art. Because the same plasma etch is used to define the micro lens array and to descum the trenches between micro lens regions prior to the hardbake reflow operation, no extra processing steps need be added to practice the inventive method as it relates to the removal of multiple process scum build up in the bond pad area. In addition, because only a single photosensitive layer is used both for passivation and planarization over color filter 106, a complete processing step has been eliminated.

Referring now to FIG. 6, there is shown a macro photograph of a portion of a micro lens display formed in accordance with the present invention. The centers of the micro lens structure 122'0 are visible as well as trenches 124'. Conspicuously missing, however, are any darkened regions 126 (FIG. 4) at intersections of trenches 124'. The novel oxygen plasma etch descum step of the invention is attributed with the elimination of defects 126 from the micro lens array formed in accordance with the present invention.

Since other modifications and changes varied to fit a particular operating requirements and environment will be apparent to those skilled in the art, the invention is not considered limited to the example chosen for purposes of disclosure, and covers all changes and modifications which do not constitute a departure from the true spirit and scope of the invention.

Having thus described the invention, what is desired to be protected by Letters Patent is presented in the subsequent appended claims.

What is claimed is:

1. A method for manufacturing a semiconductor imaging device having a micro lens layer, the steps comprising:
   a) providing a semiconductor substrate having a matrix of photosensitive devices formed thereon; the matrix of photosensitive devices defining an image field; the matrix of photosensitive devices communicating with an adjacent matrix of bond pads formed external to the image field thereby providing external communication with the imaging device;
   b) forming a first planarization layer atop the matrix of photosensitive devices and within the image field;
   c) forming a color filter layer atop the first planarization layer and within the image field;
   d) forming a second planarization layer atop the color filter layer and within the image field;
   e) depositing a layer of photo-sensitive lens forming material over the substrate;
   f) defining a matrix of regions in the layer of photo-sensitive lens forming material coinciding with the matrix of photosensitive devices within the image field on the substrate;
   g) performing a plasma etch to remove all the photosensitive lens forming material external to the image field and to form narrow cavities between the defined regions of the matrix within the image field; and
   h) heating the semiconductor substrate whereby said defined regions of the matrix within the image field are reflowed into separated micro lens structures.

2. The method for manufacturing the semiconductor imaging device having a micro lens layer as recited in claim 1, wherein the matrix of photosensitive devices comprise charge-coupled devices (CCDs).

3. The method for manufacturing the semiconductor imaging device having a micro lens layer as recited in claim 2, wherein said CCDs comprise sub-pixel regions.

4. The method for manufacturing the semiconductor imaging device having a micro lens layer as recited in claim 3, wherein said color filter layer comprises a plurality of different primary color regions, each of said plurality of different primary color regions being associated with one of said sub-pixel regions.

5. The method for manufacturing the semiconductor imaging device having a micro lens layer as recited in claim 4, wherein said primary color regions comprise red, green and blue regions.

6. The method for manufacturing the semiconductor imaging device semiconductor chips having a micro lens layer as recited in claim 1, wherein said photo-sensitive planarization layer comprises a mixture of melamine resin and generic novolac base resin materials.

7. The method for manufacturing the semiconductor imaging device semiconductor chips having a micro lens layer as recited in claim 1, wherein said defining step (f) comprises lithography.

8. The method for manufacturing the semiconductor imaging device semiconductor chips having a micro lens layer as recited in claim 1, wherein said performing a plasma etch step (g) comprises performing an oxygen plasma etch.

9. A method for forming a micro lens array on a semiconductor device, the steps comprising: providing a semiconductor substrate having a matrix of charge-coupled devices (CCDs) formed thereon; placing a color filter over said substrate; depositing a layer of thermally-reflowable material over said color filter; defining regions in said thermally flowable material associated with each of said matrix of CCDs; and thermally heating said semiconductor device whereby said defined regions are reflowed into micro lens structure, the improvement comprising: performing an oxygen plasma etch prior to said heating step whereby by any residue between said defined regions is substantially eliminated.

10. The method for manufacturing semiconductor chips having a micro lens layer as recited in claim 9, wherein said thermally-reflowable material comprises a photo-sensitive planarization layer.

11. The method for manufacturing semiconductor chips having a micro lens layer as recited in claim 9, wherein said photo-sensitive planarization layer comprises a mixture of novolac and acylic materials.

12. A method for manufacturing semiconductor chips having a micro lens layer, the steps comprising:

a) providing a semiconductor substrate having a matrix of charge-coupled devices (CCDs) formed therein, said CCDs defining active, sub-pixel regions;

b) forming a color filter layer atop said semiconductor substrate, said color filter comprising a plurality of red, green and blue regions, each associated with one of said sub-pixel regions;

c) depositing planarization layer over said color filter layer, said planarization layer comprising a novolac/acylic mixture;

d) defining regions in said planarization layer;

e) performing a oxygen plasma etch to remove substantially all residue from between said defined regions; and f) hardbaking said semiconductor substrate whereby said defined regions are reflowed into micro lens structures exhibiting substantially no bridging between said micro lens structures.

13. The method for manufacturing the semiconductor imaging device having a micro lens layer as recited in claim 1, wherein the second planarization layer is comprised of a negative photosensitive material.

14. The method for manufacturing the semiconductor imaging device having a micro lens layer as recited in claim 13, wherein the second planarization layer is comprised of a mixture of novolac and acylic.

15. The method for manufacturing the semiconductor imaging device having a micro lens layer as recited in claim 8, wherein the plasma etching step (g) of claim 1 additionally provides for the removal of all process step residues within the matrix of bond pads.

* * * * *